(12) United States Patent
Lee et al.

(10) Patent No.: US 9,224,643 B2
(45) Date of Patent: Dec. 29, 2015

(54) STRUCTURE AND METHOD FOR TUNABLE INTERCONNECT SCHEME

(75) Inventors: Chung-Ju Lee, Hsin-Chu (TW); Tien-I Bao, Hsin-Chu (TW); Ming-Shih Yeh, Chupei (TW); Hai-Ching Chen, Hsinchu (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 134 days.

(21) Appl. No.: 13/236,264

(22) Filed: Sep. 19, 2011

(65) Prior Publication Data

US 2013/0069234 A1    Mar. 21, 2013

(51) Int. Cl.
    *H01L 21/00*     (2006.01)
    *H01L 21/768*     (2006.01)
    *H01L 23/532*     (2006.01)
    *H01L 21/3213*     (2006.01)

(52) U.S. Cl.
    CPC .... *H01L 21/76885* (2013.01); *H01L 21/32134* (2013.01); *H01L 21/32136* (2013.01); *H01L 21/76852* (2013.01); *H01L 23/5329* (2013.01); *H01L 23/53238* (2013.01); *H01L 21/7682* (2013.01); *H01L 2924/0002* (2013.01)

(58) Field of Classification Search
    CPC ........... H01L 2225/06541–2225/06548; H01L 2225/107; H01L 21/02063; H01L 21/486; H01L 21/76804–21/76823; H01L 21/76877; H01L 21/76897; H01L 21/76898; H01L 23/481; H01L 23/49827; H01L 23/5226; H01L 23/5384

USPC .................. 438/98, 233, 618–620, 638–640, 438/666–668, 672–675; 257/276, 774, 257/E23.001, E23.145–E23.146, 257/E23.168–E23.175, E21.577–E21.586
See application file for complete search history.

(56) References Cited

U.S. PATENT DOCUMENTS

| | | | |
|---|---|---|---|
| 6,001,660 A * | 12/1999 | Park et al. .................... 438/3 |
| 7,227,212 B1 * | 6/2007 | Ben-Tzur et al. ............. 257/303 |
| 2003/0129850 A1 * | 7/2003 | Olgado et al. ............... 438/745 |
| 2004/0166676 A1 * | 8/2004 | Kaji et al. ...................... 438/687 |
| 2005/0142853 A1 * | 6/2005 | Tu ................................. 438/624 |
| 2005/0245077 A1 * | 11/2005 | Chou et al. .................... 438/669 |
| 2007/0063348 A1 * | 3/2007 | Yang et al. .................... 257/751 |
| 2007/0076339 A1 * | 4/2007 | Lur et al. ........................ 361/56 |
| 2007/0259516 A1 * | 11/2007 | Jahnes et al. ................. 438/618 |
| 2008/0099919 A1 * | 5/2008 | Ozawa .......................... 257/751 |
| 2008/0265369 A1 * | 10/2008 | Liaw ............................. 257/532 |
| 2010/0164116 A1 * | 7/2010 | Li et al. ......................... 257/774 |
| 2011/0287347 A1 * | 11/2011 | Sakai et al. ..................... 430/5 |
| 2012/0252206 A1 * | 10/2012 | Naik et al. .................... 438/653 |

\* cited by examiner

*Primary Examiner* — David Vu
*Assistant Examiner* — Cuong Nguyen
(74) *Attorney, Agent, or Firm* — Haynes and Boone, LLP

(57) ABSTRACT

The present disclosure provides one embodiment of a method to form an interconnect structure. The method includes forming a first dielectric material layer on a substrate; patterning the first dielectric material layer to form a plurality of vias therein; forming a metal layer on the first dielectric layer and the substrate, wherein the metal layer fills in the plurality of vias; and etching the metal layer such that portions of the metal layer above the first dielectric material layer are patterned to form a plurality of metal lines, aligned with plurality of vias, respectively.

20 Claims, 8 Drawing Sheets

STRUCTURE AND METHOD FOR TUNABLE INTERCONNECT SCHEME

BACKGROUND

An integrated circuit contains millions of transistors, capacitors and resistors on a single chip. Integration of various elements is done by forming conductive lines, such as metals, heavily doped polycrystalline silicon. As wafers have become larger and circuit scales become smaller, the interconnect conductive lines and associated dielectric materials that facilitate wiring between the transistors and other devices play more and more important role on IC performance improvement. Studies and researches are heavily conducted to search not only new conductive and dielectric materials but also new process integration schemes for a better interconnection. New interconnection materials are explored, such as integrating copper metallurgy in place of traditional aluminum to reduce the resistance component of the RC time delay, integrating a new insulating material with a lower dielectric constant (k) than the incumbent silicon dioxide to reduce the capacitance component as well as cross-talk between conductive lines to minimize time delay and power dissipation. When designing a new interconnection process scheme, there are numbers of concerns to be taken into consideration, such as the aspect ratio (AR) of the vias and trenches, the quality of metal filling in, sidewall protection of side of metal, minimizing process-induced-damage on insulation dielectric layers, good process control as well as low manufacture cost and high production throughput. Although existing approaches have been generally adequate for their intended purposes, they have not been entirely satisfactory in all respects.

In semiconductor technology, an integrated circuit pattern can be formed on a substrate using various processes including a photolithography process, ion implantation, deposition and etch. Damascene processes are utilized to form multi-layer copper interconnections including vertical interconnection vias and horizontal interconnection metal lines. During a damascene process, trenches are formed in a dielectric material layer, copper or tungsten is filled in the trenches, then a chemical mechanical polishing (CMP) process is applied to remove excessive metal on the dielectric material layer and planarize the top surface.

As the integrated circuit (IC) fabrication moves to advanced technology nodes, the IC feature size scales down to smaller dimensions. For example, the trench dimensions get smaller and smaller. Accordingly, the gap-filling ability of those metallic material is limited and the gap-filling quality and reliability are challenged. Further, the corresponding conductivity of the gap-filling metal is needed to be higher for desired performance of the interconnect structure. Thus, the interconnect material is a bottle neck for further improving the interconnect structure with required performance and reliability. Accordingly, a structure of interconnect structure and a method making the same are needed to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
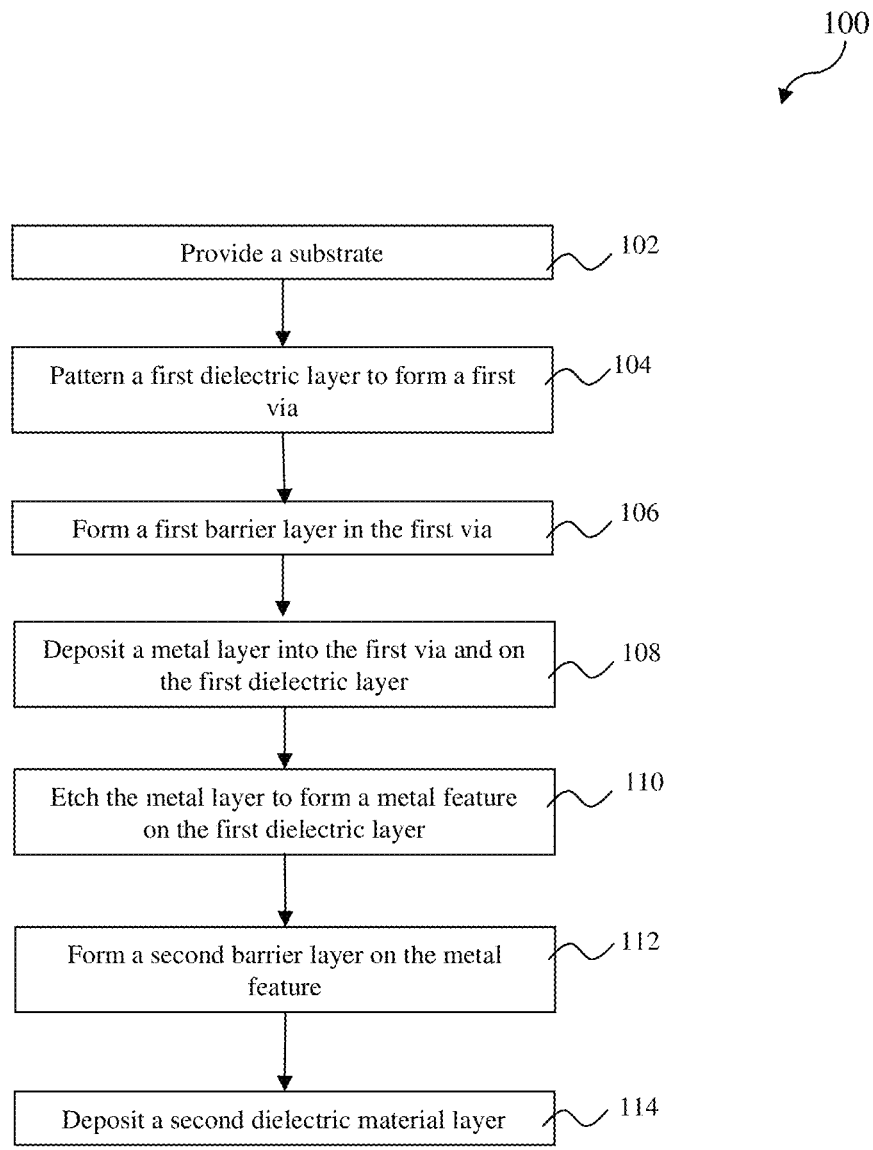
FIG. 1 illustrates a flowchart of one embodiment of a method to form an integrated circuit (IC) structure having a tunable interconnect structure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 illustrates a flowchart 100 of one embodiment of a method to form an integrated circuit (IC) structure having a tunable interconnect structure. FIGS. 2 through 7 illustrate sectional views of an IC structure (or semiconductor structure) 200 having a tunable interconnect structure during various fabrication stages and constructed according to various aspects of the present disclosure in one or more embodiments. The method 100 and the IC structure 200 are collectively described below with reference to FIGS. 1 through 7. Additional steps can be provided before, during, and after the method 100, and some of the steps described can be replaced or eliminated for additional embodiments of the method. The discussion that follows illustrates various embodiments of the IC structure 200 that can be fabricated according to the method 100 of FIG. 1.

Figure 2:
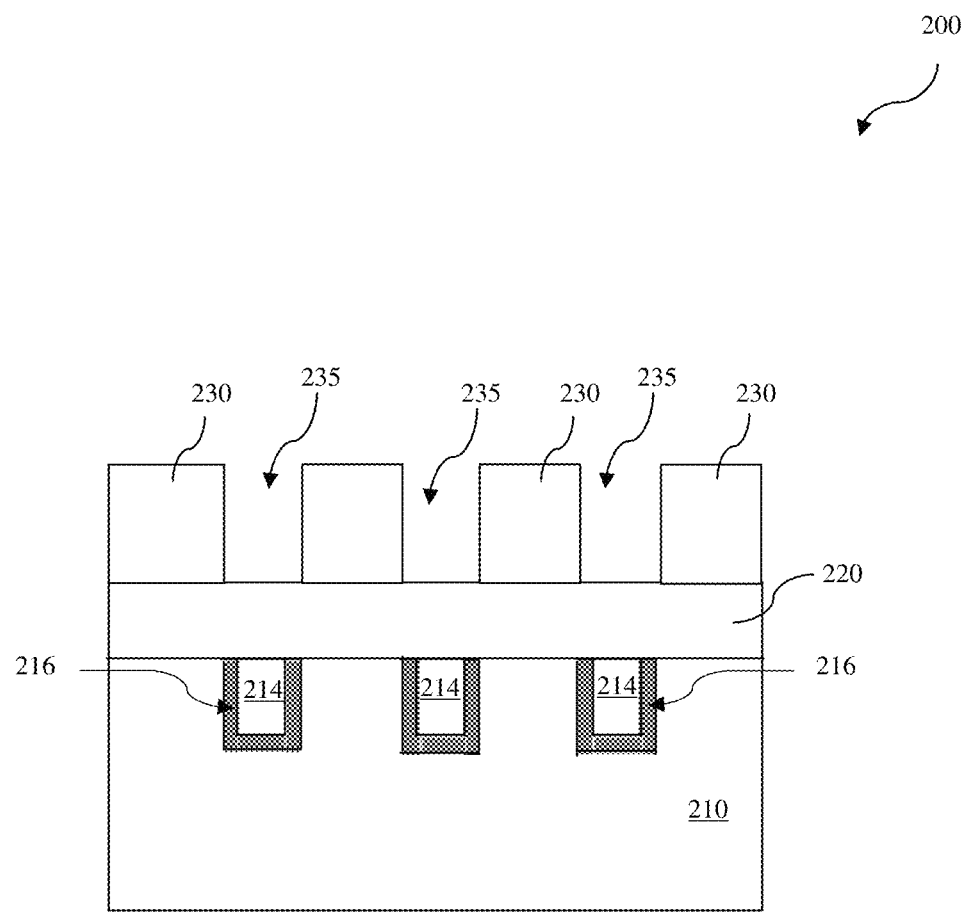
FIGS. 2 through 8 illustrate sectional views of an IC structure having a tunable interconnect structure during various fabrication stages and made by the method of FIG. 1, constructed according to various aspects of the present disclosure in one or more embodiments.

Referring to FIGS. 1 and 2, the method 100 begins at step 102 by providing a semiconductor substrate 210. The semiconductor substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate may have an epitaxial layer overlying a bulk semiconductor. Furthermore, the substrate 210 may include a semiconductor-on-insulator (SOI) structure. For example, the substrate may include a buried oxide (BOX) layer formed by a process such as separation by implanted oxygen (SIMOX) or other suitable technique, such as wafer bonding and grinding. The substrate 210 also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate. The substrate 210 further include lateral isolation features provided to separate various devices formed in the substrate 210. In one embodiment, shallow trench isolation (STI) features are used for lateral isolation. The various IC devices may further include other features, such as silicide disposed on S/D and gate stacks overlying channels.

The semiconductor structure 210 may also include a plurality of dielectric layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and is collectively referred to as the substrate 210. The interconnect structure is further described later.

As noted above, the semiconductor structure 210 includes an interconnect structure. The interconnect structure includes a multi-layer interconnect (MLI) structure and an inter-level dielectric (ILD) integrated with the MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Exemplary conductive features 214 are shown in FIG. 2 for illustration. In one embodiment, the conductive features 214 include a portion of the interconnect structure> For example, the conductive feature 214 includes a contact, a metal via, or a metal line. In this case, the conductive features 214 may be further surrounded by a barrier layer 216 to prevent diffusion and/or provide material adhesion. The conductive feature 214 may include aluminum (Al), copper (Cu) or tungsten (W). The barrier layer 216 may include titanium nitride (TiN), tantalum nitride (TaN), tungsten nitride (WN), titanium silicon nitride (TiSiN) or tantalum silicon nitride (TaSiN). The conductive features 214 and the barrier layer 216 may be formed by a procedure including lithography, etching and deposition. In another embodiment, the conductive feature 214 includes an electrode of a capacitor, a resistor or a portion of a resistor. Alternatively, the conductive features 214 include a doped region (such as a source or a drain), or a gate electrode. In another example, the conductive features 214 are silicide features disposed on respective source, drain or gate electrode. The silicide feature may be formed by a self-aligned silicide (salicide) technique.

The method 100 proceeds to step 104 by forming one or more first trenches in a first dielectric material layer 220. The first dielectric material layer 220 is disposed on the substrate 210 and the conductive features 214. The first dielectric material layer 220 includes one dielectric material layer, such as silicon oxide, silicon nitride, a dielectric material layer having a dielectric constant (k) lower than thermal silicon oxide (therefore referred to as low-k dielectric material layer), or other suitable dielectric material layer. In various examples, the low k dielectric material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), poly-imide, and/or other materials as examples. In another example, the low k dielectric material may include an extreme low k dielectric material (XLK). In another example, the low k dielectric material layer includes a porous version of an existing Dow Corning dielectric material called FOX (flowable oxide) which is based on hydrogen silsesquioxane. A process of forming the first dielectric material layer 220 may utilize spin-on coating or chemical vapor deposition (CVD). In one example, a chemical mechanical polishing (CMP) process may be used to further planarize the top surface of the first dielectric material layer 220.

As illustrated in FIG. 2, a patterned photoresist layer (or patterned resist layer) 230 is formed on the first dielectric material layer 220. The patterned resist layer 230 includes various openings 235 that define portions of the first dielectric material layer 220 for vias and expose those portions for subsequent etch. Particularly, the openings 235 are aligned with respective conductive features 214. In one embodiment, the patterned resist layer 230 is formed by a procedure including coating, exposure, post exposure baking, and developing. Particularly, the resist coating may utilize spin-on coating. In one example of the exposure, the coated resist layer is selectively exposed by radiation beam through a mask having a predefined pattern. The radiation beam includes ultraviolet (UV) light in one example. The exposing process may be further extended to include other technologies such as a maskless exposing or writing process. After the exposing process, the resist layer 230 is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. Thus the resist layer is patterned to have one or more openings 235 as illustrated in FIG. 2. The lithography processes described above may only present a subset of processing steps associated with a lithography patterning technique. The lithography process may further include other steps such as cleaning and baking in a proper sequence. For example, the developed resist layer may be further baked, referred to as hard baking.

Figure 3:
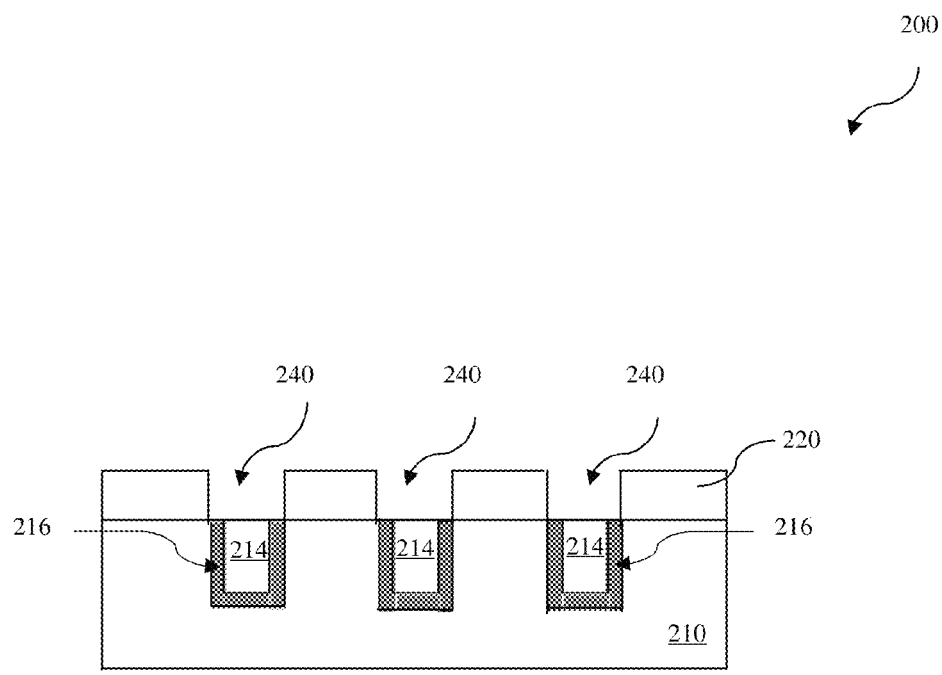

As illustrated in FIG. 3, the first dielectric layer 220 is etched through the openings 235 of the patterned resist layer 230 using the patterned resist layer 230 as an etch mask, resulting in one or more first vias 240 in the first dielectric layer 220 such that the respective conductive features 214 are at least partially exposed within the vias 240. The first dielectric layer 220 exposed within the openings 235 of the resist layer 230 is removed by an etch technique such as dry etch, wet etch, or combinations thereof. In one example, the etch process utilizes a medium-density plasma etch system using capacitively coupled plasmas, or a high-density plasma etch system that utilizes either inductive, helicon, or electron cyclotron resonance (ECR) plasmas, wherein the exposed dielectric material is anisotropically removed by fluorocarbon plasma, forming the vias 240, as illustrated in FIG. 3. Other dry-etch process may be alternatively used. The mechanism of etching in each dry-etch process may have a physical basis (e.g. glow-discharge sputtering, or ion milling) or a chemical basis (e.g., in pure plasma etching) or a combination of the both (e.g., reactive ion etching or RIE). Sputtering relies on directional nature of the incident energetic ions to etch in a highly anisotropic manner. When etching selectivity between masking material and under layer material is not adequate. Pure plasma etching, a chemical basis etching, may achieve a very high selectivity against both mask material and underlying layers and typically etch in an isotropic fashion. By combining both physical and chemical mechanism etch offers a controlled anisotropic etch with adequate selectivity. Thereafter, the photo resist layer 230 may be removed by a process such as wet stripping or O2 plasma ashing. In another alternative embodiment, an etch stop layer is disposed between the substrate 210 and the first dielectric material layer 220 and the etch process includes a dry etch to etch through the first dielectric material layer and stops at the etch stop layer. The etch process may further include a wet etch to remove the etch stop layer within the vias 240. In another example, a hard mask may be utilized as an etch mask during the etch process to pattern the first dielectric material layer.

Figure 4:
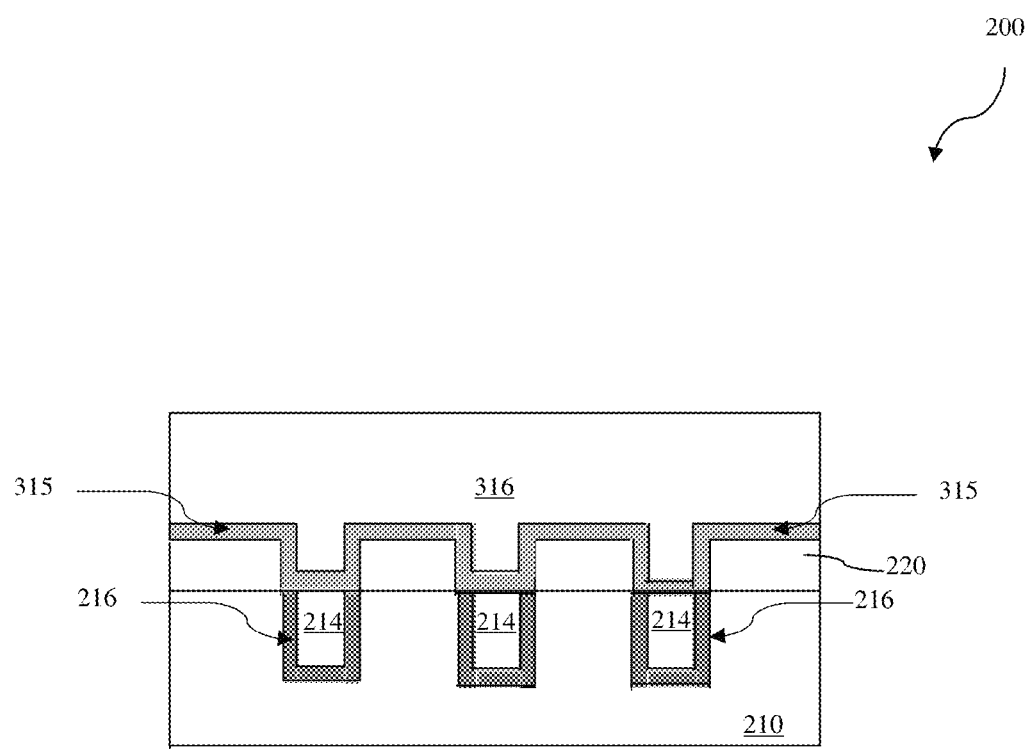

Referring to FIGS. 1 and 4, the method 100 may proceed to step 106 by forming a first barrier layer 315 in the first vias 240, as well as on the top of the first dielectric material layer 220. In one embodiment, the first barrier layer 315 includes metal and is electrically conductive but does not permit interdiffusion and reactions between the first dielectric material layer and a metal layer to be filled in the vias 240. The first barrier layer 315 may include refractory metals and their nitrides. In various examples, the first barrier layer 315 includes TiN, TaN, Co, WN, TiSiN, TaSiN, or combinations thereof. The first barrier layer 315 may include multiple films. For example, Ti and TiN films are used as the first barrier layer. The first barrier layer 315 may be deposited by physical vapor deposition (PVD), chemical vapor deposition (CVD), metal-organic chemical vapor deposition (MOCVD) and atomic layer deposition (ALD), or other suitable technique.

Still referring to FIGS. 1 and 4, the method 100 proceeds to step 108 by forming a metal layer 316 on the first barrier layer 315. The metal layer 316 fills in the first vias 240 and further disposed on the over the first dielectric material layer 220. The metal layer 316 may include copper (Cu), aluminum (Al), tungsten (W) or other suitable conductive material. In the present embodiment with enhanced etch effect, the metal layer includes copper or copper alloy, such as copper magnesium (CuMn), copper aluminum (CuAl) or copper silicon (CuSi). In furtherance of the present embodiment, the Mn concentration of the copper magnesium alloy ranges between about 0.5% and about 2% in weight. In one embodiment, the metal layer 316 includes a copper layer deposited by PVD. In one embodiment, the metal layer 316 includes a copper seed layer deposited by PVD and bulk copper layer by plating. In various other examples, copper deposition may be implemented by other techniques, such as PVD, CVD, MOCVD, or plating. A Cu reflow process may be added to enhance Cu filling profile.

Figure 5:
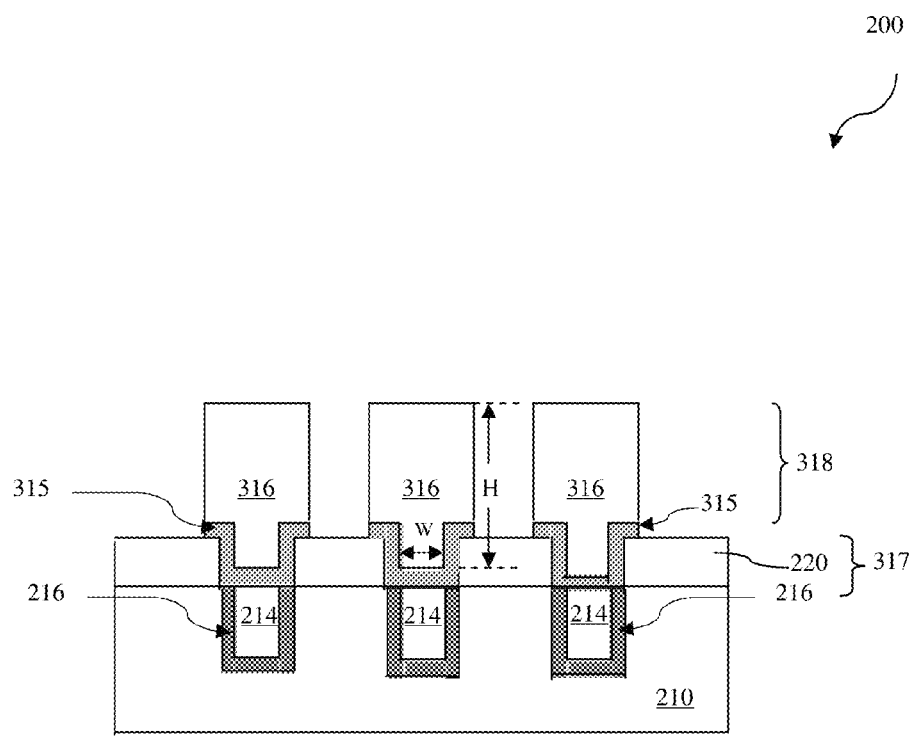

Referring to FIGS. 1 and 5, the method 100 proceeds to step 110 by patterning the metal layer 316 to form one or more metal features on the first dielectric material layer 220. The method for patterning the metal layer 316 includes a lithography process and etching. In the lithography process, a patterned resist layer is formed on the metal layer 316 as an etch mask having various openings that exposes the regions of the metal layer to be removed. The lithography technique to form the patterned resist layer is similar to form the patterned resist layer 230.

A metal etch process is applied to the metal layer 316 through the openings of the etch mask, resulting in various metal features 317 in the vias 240 and metal features 318 over the first dielectric material layer 220, as illustrated in FIG. 5. In one embodiment when the underlying conductive features 214 are metal lines of a different metal layer, the metal features 317 in the vias 240 are also referred to as metal vias, via features or vias to provide vertical electrical routing between metal lines. In an alternative embodiment when the underlying conductive features 214 are source/drain features and/or gate electrodes, the metal features 317 in the vias 240 are also referred to as metal contact, contact features or contacts to provide electrical routing between metal lines and semiconductor substrate. In another embodiment, the metal features 318 over the first dielectric material layer 220 are referred to as metal lines to provide horizontal electrical routing.

The metal etch process is implemented using plasma etch. Usually Cu is considered to be difficult to etch in plasma etching processes due to it forms an etch product with chlorine-CuCl, which is relatively nonvolatile below certain temperature degree. Thus copper may not be plasma etched with any one of the enchant gases containing chlorine. Therefore Cu etch may not be achieved by a traditional subtractive etching approach used to form aluminum metal lines. So to overcome the nonvolatile copper compound and apply a appropriate gas combination have become a challenging task for Cu plasma etch. In one embodiment, the etch gas include carbon, hydrogen, oxygen and nitrogen. In another embodiment, the copper etch gas applied in Cu plasma etch includes a hydrogen containing gas, such as $C_xH_y$, $C_xF_y$, $C_xH_yF_z$, or combinations thereof. The subscript x, y or z has a value greater than 0 and less than 6. The subscripts x, y and z may be omitted for simplicity in the following description. In this embodiment, the copper etch gas applied in Cu plasma etch further includes at least one of CO and O2, and at least one of N2 and Ar. In a particular example, the gas flows for the hydrogen containing gas ranges between about 1 sccm and about 100 sccm; the gas flow of CO (or O2) ranges between about 1 sccm and about 500 sccm; and the gas flow of N2 (or Ar) ranges between about 1 sccm and about 1000 sccm. In furtherance of the present example, the plasma etch temperature (substrate temperature) is within a range of about 20 C and about 250 C. In another example, the plasma etch temperature is within a range of about 20 C and about 80 C. Our experiments indicate that the CuMn alloy has a higher etch rate. Some of our experiments further show that the etch rate is about 1.5 to 3 times of the etch rate of the copper metal layer without magnesium content.

The method to pattern the metal layer 316 is described above, other embodiments are present. In one embodiment, a wet etch process may be alternatively or additionally used to pattern the metal layer 316. In yet another embodiment, when the metal layer 316 includes other suitable metal, such as aluminum or tungsten, other etch gas may be used. In yet another embodiment, a hard mask, such as silicon oxide, silicon carbide, silicon nitride, titanium nitride, or tantalum nitride may be formed as an etch mask by a procedure including lithography and etching.

In single damascene (SD) and dual damascene (DD) processes, Cu and low k dielectric interconnect scheme (via first or trench first) raises process challenges of etching deep trench and metal filling in the deep trench, which is represented by aspect ratio (AR). The related challenges includes: high AR trench etch and high AR metal filling. As aspect ratio of features increases, complexity of plasma etching increases such as etch rate decreasing, charging of features due to ion and electron bombardment and non-uniform ion flux. An adequate metal filling step coverage on sidewall and bottom of a high AR trench become more and more difficulty with increasing AR. To achieve an adequate high AR etch and metal filling often leads to an equipment upgrade, a costly option. In the depicted embodiment, AR is the ratio of the height H (metal line thickness+via depth) to via opening dimension W as shown in FIG. 5. By changing metal deposition thickness, a tunable metal line thickness can be achieved without involving challenging processes of high AR metal etch and metal filling as well as equipment upgrade. This is because metal etch is not through the total thickness H of the deposited metal layer 316 and the dielectric etch to form the trenches is not to reach the same dimension H. As one example of tuning AR, metal thickness is 900 A or more and via dimension 200 A, therefore the corresponding AR is 4.5 or more.

The method 100 further includes etching the first barrier layer 315 within the gaps between the metal lines 318 such that the first dielectric material layer 220 within the gaps between the metal lines 318 are exposed. In one embodiment, the etch process to form the metal lines 318 includes a first etch sub-step to etch the metal layer 316 as described above and a second etch sub-step to etch the first barrier layer 315, such as dry etch or wet etch. In one embodiment, the second etch sub-step to etch the first barrier layer 315 includes a dry etch using a gas including CxFx, N2 (or Ar), CxHy, and Cl2 (or HBr). In a particular embodiment, the corresponding gas flows for CxFy, N2 (or Ar), CxHy, and Cl2 (or HBr) range from about 1 sccm to about 200 sccm, from about 1 sccm to about 1000 sccm, from about 1 sccm to about 200 sccm, and from about 1 sccm to about 200 sccm, respectively. In another embodiment, a wet etch is used to etch the first barrier layer 315 and the corresponding etchant includes a standard clean solution (SC1) having $NH_4OH$, $H_2O_2$ and $H_2O$. In one particular embodiment, the etchant $NH_4OH$, $H_2O_2$ and $H_2O$ is mixed as a solution with ratios of 1:1:5.

Figure 6:
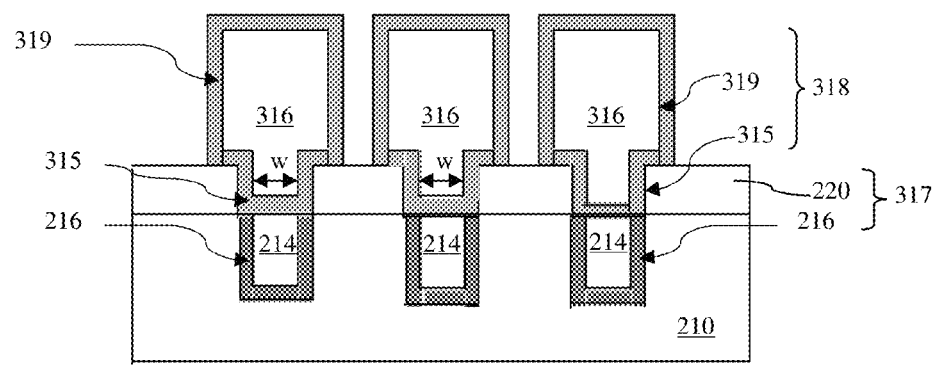

Referring to FIGS. 1 and 6, the method 100 proceeds to step 112 by forming a second barrier layer 319. The second barrier layer 319 is deposited on the top surface and sidewalls of the metal features 318, as illustrated in FIG. 6. The second barrier layer 319 includes a material different from that of the first barrier layer 315. In one embodiment, the second barrier layer 319 includes cobalt or nickel, such as cobalt tungsten phosphorus (CoWP), cobalt phosphorus (CoP), nickel tungsten boron (NiWP), or nickel boron (NiB). In another embodiment, the second barrier layer 319 is deposited using a technique such that the second barrier layer 319 is selectively deposited on the surfaces of the metal lines 319 but not on the first dielectric material layer 220. Therefore, the second barrier layer 319 is self-aligned with the metal lines 318. In the present embodiment, the second barrier layer 319 is deposited by electroless plating technique and is self-aligned with the metal lines 318. The electroless plating technique provides a low process temperature, an intrinsic process selectivity and conformal deposition. Further in this embodiment, by creating a Cu/metal (second barrier layer) to replace Cu/dielectric interface can significantly reduce Cu electromigration and diffusion. It also provide a better moisture protection layer. In one embodiment, a chemical cleaning process is applied to the copper lines before the electro-less plating to form the first barrier layer.

Figure 7:
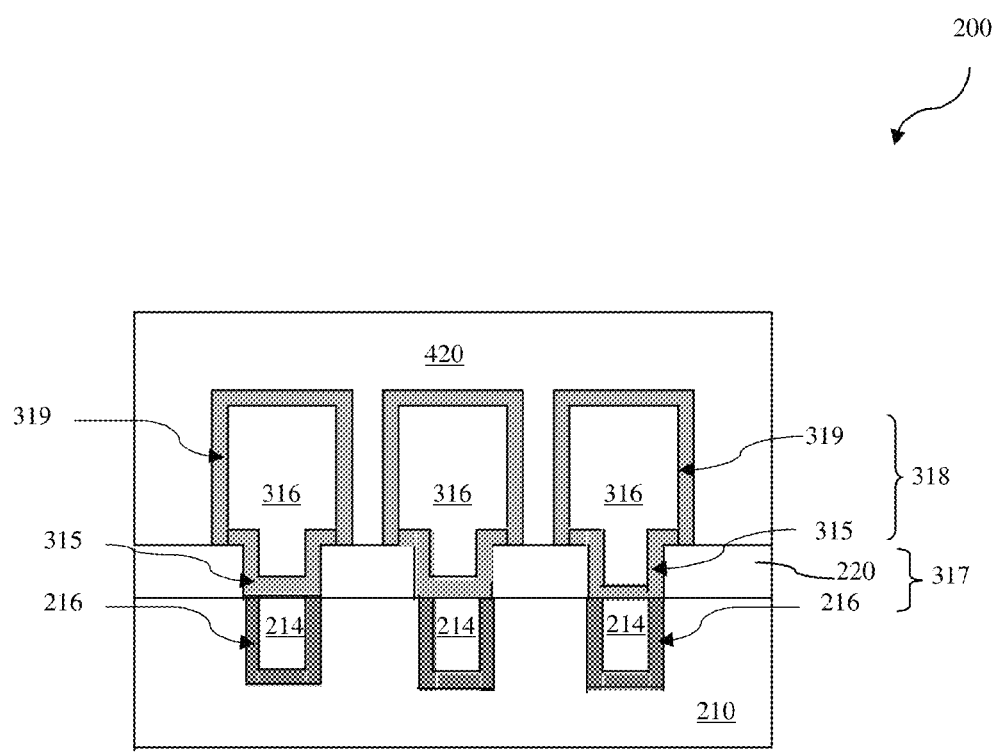

Referring to FIGS. 1 and 7, the method 100 proceeds to step 114 by forming a second dielectric material layer 420 around the metal lines 318. In one embodiment, the second dielectric material layer 420 is similar to the first dielectric material layer 220 in term of composition. For example, the second dielectric material layer 420 includes a low-k dielectric material, silicon oxide, or other suitable dielectric material layer. The second dielectric material layer 420 is disposed on the second barrier layer 319 and on the first dielectric material layer 220. In one embodiment, the second dielectric material layer 420 substantially fills the regions between the metal lines 318. Alternatively, the second dielectric material layer 420 disposed between the metal lines 318 includes voids (or air gaps) to further reduce the average dielectric constant and increase the isolation efficiency. The air gaps may be formed by choosing and tuning a proper deposition process to form the second dielectric material layer 420.

In one embodiment, the second dielectric material layer 420 is deposited by CVD and the CVD deposition is tuned to form the air gaps. For example, when the CVD deposition rate is tuned to be higher such that the second dielectric material layer 420 closes up before completely filling in the regions between the metal lines 318, resulting in the air gaps. In another embodiment, the second dielectric material layer 420 is deposited by a spin-on dielectric (SOD) process to substantially fill in the regions between the metal lines 318.

The dielectric layer 420 is deposited after metal lines 318 are formed, therefore it avoids the second dielectric material layer 420 to experience plasma damage by being exposed in metal deposition and etch. The plasma damage may degrade low k value and causes poor capacitance performance of the circuit. The deposition of dielectric layer 420 also carries along with a self-form air-gap capability between metal lines 318. A chemical mechanical polishing (CMP) process may be applied to the second dielectric material layer 420 for planarization effect if a desired topography is needed.

Various advantages may present in one or more embodiments of the semiconductor structure and the corresponding method. In an alternative embodiment, the metal features 317 are metal lines and the metal features 318 are via features. In another embodiment, other process steps may be implemented before, during and/or after the method 100. In another embodiment, the semiconductor substrate 210 includes other IC devices, such as memory devices or imaging sensors. Other advantages may be present in various embodiment. In one embodiment, an etch stop layer between the first and second dielectric material layers (220 and 420) is not necessary since the first barrier layer 315 may function as an etch mask when the etch process has an etch selectivity between the metal layer 316 and the first barrier layer 315. In another embodiment, a CMP process usually applied to the metal layer 316 of copper is eliminated with reduced manufacturing cost and reduced manufacturing cycle time since the metal features 318 are not formed by a damascene process.

Thus, the present disclosure provides one embodiment of a method. The method includes forming a first dielectric material layer on a substrate; patterning the first dielectric material layer to form a plurality of vias therein; forming a first barrier layer of a first material in the plurality of vias and on the first dielectric material layer; forming a metal layer on the first barrier layer, wherein the metal layer fills in the plurality of vias; etching the metal layer and the first barrier layer such that portions of the metal layer and the first barrier layer above the first dielectric material layer are patterned to form a plurality of metal lines, aligned with plurality of vias, respectively; and forming a second barrier layer of a second material on surfaces of the plurality of metal lines, the second material being different from the first material.

In one embodiment, the method further includes forming a second dielectric material on the plurality of metal lines and in gaps between neighbor metal lines. The forming of a second dielectric material layer may includes forming air voids inside the second dielectric material layer. In another embodiment, each of the first and second dielectric material layers include a low-k dielectric material. In another embodiment, the forming of a metal layer includes forming a copper magnesium (CuMn) alloy layer. In another embodiment, etching the metal layer and the first barrier layer includes performing a first etch step to the metal layer with a gas containing oxygen, hydrogen and nitrogen. The performing of a first etch step to the metal layer may include performing a plasma etching process with a first gas containing at least one of CxHy, CxFy and CxHyFz; one of CO and O2; and one of N2 and Ar. In another embodiment, the etching of the metal layer and the first barrier layer includes performing a second etch step to the first barrier layer with a gas containing at least one of CxFy; CxHy; one of Cl2 and HBr; and one of N2 and Ar. The etching of the metal layer and the first barrier layer may utilize an etch mask selected from one of a patterned photoresist layer and a patterned hard mask layer. The forming of a second barrier layer includes forming the second barrier layer self-aligned with the plurality of metal lines using electro-less plating. The forming of a second barrier layer includes electro-less plating a material selected from the group consisting of nickel tungsten phosphorous (NiWP), cobalt tungsten phosphorous (CoWP), nickel boron (NiB), cobalt boron (CoB), and combinations thereof.

Figure 8:
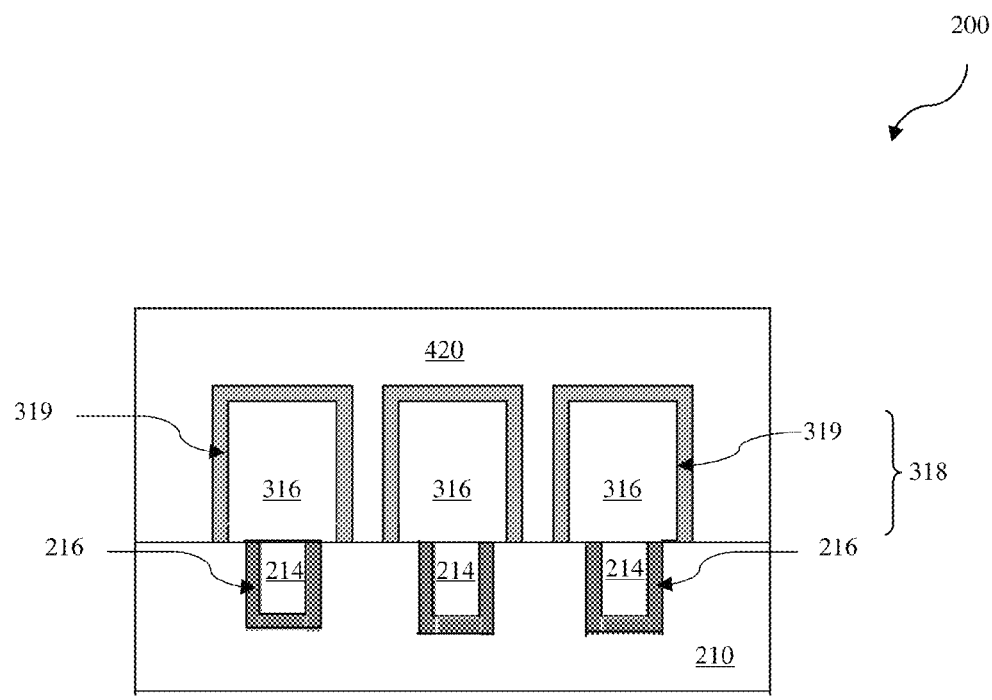

The present disclosure also provides another embodiment of a method to form metal lines. As shown in FIG. 8, the method includes forming a metal layer, such as a cooper layer, on a substrate 210 by using sputtering and plating technique, forming a patterned hard mask layer on the copper layer and having a plurality of openings, etching the copper layer using a plasma etch with a carbon, nitrogen, oxygen and hydrogen containing etchant gas such that a portion of the copper layer to form a plurality of copper lines 316, forming a barrier layer 319 self-aligned to surfaces of the plurality of copper lines using electro-less plating, and forming a low-k dielectric material 420 on the barrier layer 319 and the substrate exposed between neighbor copper lines.

The present disclosure also provides yet another embodiment of a method. The method includes forming a first low-k dielectric material layer on a semiconductor substrate; patterning the first low-k dielectric material layer to form a plurality of trench therein; forming a copper layer on the semiconductor substrate using sputtering and plating, the copper layer being disposed in the plurality of trenches and over the first low-k dielectric material layer; etching the copper layer using a plasma etch with a nitrogen, oxygen and hydrogen containing etchant such that a portion of the copper layer over the first low-k dielectric material layer are patterned to form a plurality of copper lines, aligned with plurality of trenches, respectively; forming a first barrier layer self-aligned to surfaces of the plurality of copper lines using electro-less plating; and forming a second low-k dielectric material on the barrier layer and the first low-k dielectric material layer exposed between neighbor copper lines.

In one embodiment, the method further includes forming a second barrier layer in the plurality of trenches and on the first low-k dielectric material layer before forming the copper layer, the second barrier layer including one of tantalum nitride, titanium nitride and cobalt. In another embodiment, the forming of a second barrier layer includes implementing a technique selected from the group consisting of atomic layer deposition (ALD), chemical vapor deposition (CVD) and physical vapor deposition (PVD). In another embodiment, the etching of the copper layer further includes etching the second barrier layer. The forming of a copper layer may include forming a copper seed layer by sputtering; and form a bulk copper layer by plating. The forming of a first barrier layer may include performing a chemical cleaning process to the copper lines before the electro-less plating. In one embodiment, the forming of a first barrier layer includes electro-less plating a material selected from the group consisting of nickel tungsten phosphorous (NiWP), cobalt tungsten phosphorous (CoWP), nickel boron (NiB), cobalt boron (CoB), and combinations thereof.

The present disclosure also provides one embodiment of a semiconductor structure. The semiconductor structure includes a first low-k dielectric material layer disposed on a semiconductor substrate; first copper alloy features embedded in the first low-k dielectric material; a first barrier layer of a first material, surrounding the first copper alloy features and interposed between the first low-k dielectric material layer and the first copper alloy features; a second low-k dielectric material layer disposed on the first low-k dielectric material layer; second copper alloy features embedded in the second low-k dielectric material; and a second barrier layer of a second material, surrounding the second copper alloy features and interposed between the second low-k dielectric material layer and the second copper alloy features, wherein the second material being different from the first material.

In one embodiment, each of the first and second copper alloy features further includes magnesium (Mn). In another embodiment, the first material is selected from the group consisting of tantalum nitride, titanium nitride and cobalt. In yet another embodiment, the second material is selected from the group consisting of nickel tungsten phosphorous (NiWP), cobalt tungsten phosphorous (CoWP), nickel boron (NiB), cobalt boron (CoB), and combinations thereof.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   forming a first dielectric material layer on a substrate;
   patterning the first dielectric material layer to form a plurality of vias therein;
   forming a first barrier layer of a first material in the plurality of vias and on the first dielectric material layer;
   forming a metal layer, contacting the first barrier layer, on the first dielectric layer and the substrate, wherein a portion of the metal layer fills the plurality of vias and a portion of the metal layer overlies the first dielectric layer;
   patterning the metal layer and the first barrier layer by a lithography process and etching such that portions of the metal layer above the first dielectric material layer are patterned to form a plurality of metal lines aligned with the plurality of vias, respectively, wherein said patterning includes:
      performing a first etch step to the metal layer with a first gas containing carbon, oxygen, hydrogen, and nitrogen; and
      performing a second etch step to the first barrier layer with a second gas containing at least one of CF and CH; one of $Cl_2$ and HBr; and one of $N_2$ and Ar; and
   forming a second barrier layer of a second material contacting a top surface and sidewalls of the plurality of metal lines, the second material being different from the first material.

2. The method of claim 1, further comprising forming a second dielectric material layer on the plurality of metal lines and in gaps between neighbor metal lines.

3. The method of claim 2, wherein forming the second dielectric material layer includes forming air voids inside the second dielectric material layer.

4. The method of claim 2, wherein each of the first and second dielectric material layers includes a low-k dielectric material.

5. The method of claim 1, wherein forming the metal layer includes forming a copper-containing material selected from a group consisting of copper (Cu), copper magnesium (CuMn), copper aluminum (CuAl), copper silicon (CuSi) and combinations thereof.

6. The method of claim 1, wherein the performing the first etch step to the metal layer includes performing a plasma etching process with the first gas containing at least one of CH, CF and CHF; one of CO and $O_2$; and one of $N_2$ and Ar.

7. The method of claim 1, wherein the patterning the metal layer utilizes an etch mask of a material selected from a group consisting of photoresist, SiC, SiN, $SiO_2$, TaN, and TiN.

8. The method of claim 1, wherein the forming the second barrier layer includes forming the second barrier layer self-aligned with the plurality of metal lines using electro-less plating.

9. The method of claim 8, wherein the forming the second barrier layer includes electro-less plating a material selected from a group consisting of nickel tungsten phosphorous (NiWP), cobalt tungsten phosphorous (CoWP), nickel boron (NiB), cobalt boron (CoB), and combinations thereof.

10. A method, comprising:
   forming a first dielectric material layer on a substrate;
   patterning the first dielectric material layer to form a plurality of vias therein;
   forming a first barrier layer of a first material in the plurality of vias and on the first dielectric material layer;
   forming a copper layer, contacting the first barrier layer, on the first dielectric layer and the substrate, wherein the copper layer fills the plurality of vias;
   forming an etch mask on the copper layer, wherein the mask layer includes a plurality of openings;
   etching the copper layer through the plurality of openings of the etch mask with a first gas containing carbon, oxygen, hydrogen, and nitrogen such that portions of the copper layer above the first dielectric material layer are patterned to form a plurality of metal lines aligned with the plurality of vias, respectively;
   etching the first barrier layer with a second gas containing at least one of CF and CH; one of $Cl_2$ and HBr; and one of $N_2$ and Ar; and
   forming a second barrier layer of a second material contacting a top surface and sidewalls of the plurality of metal lines.

11. The method of claim 10, wherein forming the etch mask includes forming a patterned resist layer on the copper layer by a lithography process.

12. The method of claim 10, further comprising forming a second dielectric material layer on the plurality of metal lines and in gaps between adjacent metal lines.

13. The method of claim 12, wherein forming the second dielectric material layer includes forming air voids inside the second dielectric material layer.

14. The method of claim 12, wherein each of the first and second dielectric material layers includes a low-k dielectric material.

15. The method of claim 10, wherein forming the second barrier layer of the second material in the plurality of vias and on the first dielectric material layer prior to the forming of the copper layer, wherein the copper layer is formed on the second barrier layer; and wherein the first material is selected from a group consisting of nickel tungsten phosphorous (NiWP), cobalt tungsten phosphorous (CoWP), nickel boron (NiB), cobalt boron (CoB), and combinations thereof, and the second material is different from the first material.

16. The method of claim 15, wherein forming the second barrier layer includes self-aligning the second barrier layer with the plurality of metal lines using electro-less plating.

17. The method of claim 10, wherein the plurality of metal lines and the plurality of vias have an aspect ratio of 4.5 or more, wherein the aspect ratio is a ratio of a height to a width, the height being a total thickness of the plurality of metal lines and the plurality of vias, and the width being an opening dimension of the plurality of vias.

18. A method, comprising:
   providing a substrate having a plurality of metal features;
   forming a first dielectric material layer on the substrate;
   patterning the first dielectric material layer to form a plurality of vias therein, wherein the metal features are exposed within the vias;
   forming a first barrier layer in the plurality of vias and on the first dielectric material layer;
   forming a copper layer, contacting the first barrier layer, on the first dielectric layer and the substrate, wherein a portion of the copper layer fills the plurality of vias;
   etching the copper layer through openings of an etch mask with a first gas containing carbon, oxygen, hydrogen, and nitrogen such that portions of the copper layer above the first dielectric material layer are patterned to form a plurality of metal lines;
   etching the first barrier layer with a second gas containing at least one of CF and CH; one of $Cl_2$ and HBr; and one of $N_2$ and Ar; and
   forming a second barrier layer in contact with a top surface and sidewalls of the plurality of metal lines, the first barrier layer formed from a first material that is different than a second material of which the second barrier layer is formed.

19. The method of claim 18, wherein the copper layer is formed on the first dielectric layer and the substrate, wherein the copper layer fills the plurality of vias; and wherein the copper layer is electrically connected to the plurality of metal features.

20. The method of claim 18, wherein the plurality of metal lines and the plurality of vias have an aspect ratio of 4.5 or more, wherein the aspect ratio is a ratio of a height to a width, the height being a total thickness of the plurality of metal lines and the plurality of vias, and the width being an opening dimension of the plurality of vias.

* * * * *